(12) United States Patent
Kürten

(10) Patent No.: US 11,201,098 B2
(45) Date of Patent: Dec. 14, 2021

(54) SEMICONDUCTOR MODULE HAVING A BASE PLATE WITH A CONCAVE CURVATURE

(71) Applicant: Siemens Aktiengesellschaft, Munich (DE)

(72) Inventor: Bernd Kürten, Obermichelbach (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 219 days.

(21) Appl. No.: 16/479,842

(22) PCT Filed: Jan. 19, 2018

(86) PCT No.: PCT/EP2018/051258
§ 371 (c)(1),
(2) Date: Jul. 22, 2019

(87) PCT Pub. No.: WO2018/134332
PCT Pub. Date: Jul. 26, 2018

(65) Prior Publication Data
US 2021/0193554 A1 Jun. 24, 2021

(30) Foreign Application Priority Data
Jan. 23, 2017 (EP) .................................... 17152692

(51) Int. Cl.
*H01L 23/373* (2006.01)
*H01L 23/40* (2006.01)
(Continued)

(52) U.S. Cl.
CPC ...... *H01L 23/3735* (2013.01); *H01L 23/4006* (2013.01); *H01L 23/492* (2013.01);
(Continued)

(58) Field of Classification Search
CPC ... H01L 23/3735; H01L 24/32; H01L 23/492; H01L 23/4006; H01L 24/83;
(Continued)

(56) References Cited

U.S. PATENT DOCUMENTS 7,910,952 B2 * 3/2011 Tschirbs ................ H01L 23/492
257/177
9,887,154 B2 * 2/2018 Takahashi ........... H01L 23/3735
(Continued)

FOREIGN PATENT DOCUMENTS

DE 102004021075 A1 12/2004
DE 102008036112 A1 2/2009
(Continued)

OTHER PUBLICATIONS

"PCT International Search Report and Written Opinion of International Searching Authority dated Apr. 26, 2018 corresponding to PCT International Application Nr. PCT/EP2018/051258 filed Jan. 19, 2018".

*Primary Examiner* — Vu A Vu
(74) *Attorney, Agent, or Firm* — Henry M. Feiereisen LLC

(57) ABSTRACT

A structured metal layer in contact with an electronic component is applied on an upper side of a substrate of electrically insulating material. A metallic contact layer is applied to an underside of the substrate, with the underside configured as planar surface in a state of the substrate that is free of mechanical stress. The contact layer is connected to a metallic base plate via an intermediate layer. The contact layer is connected to the metallic base plate at an elevated temperature. The semiconductor module is then cooled. The side of the metallic base plate facing the substrate and the side of the metallic base plate facing away from the substrate are configured as planar surfaces in a state of the base plate that is free of mechanical stress. Upon cooling of the
(Continued)

semiconductor module, the base plate forms a concave curvature on its side facing away from the substrate.

22 Claims, 2 Drawing Sheets

(51) Int. Cl.
*H01L 23/492* (2006.01)
*H01L 23/00* (2006.01)

(52) U.S. Cl.
CPC .............. *H01L 24/32* (2013.01); *H01L 24/83* (2013.01); *H01L 2224/32245* (2013.01); *H01L 2224/8384* (2013.01); *H01L 2224/83801* (2013.01); *H01L 2924/3511* (2013.01)

(58) Field of Classification Search
CPC . H01L 2224/83801; H01L 2224/32245; H01L 2924/3511; H01L 2224/8384
USPC ......................................................... 257/706
See application file for complete search history.

(56) References Cited

U.S. PATENT DOCUMENTS

| | | |
|---|---|---|
| 2004/0232544 A1 | 11/2004 | Mochizuki et al. |
| 2008/0101032 A1 | 5/2008 | Tschirbs et al. |
| 2009/0039498 A1 | 2/2009 | Bayerer |
| 2015/0325494 A1* | 11/2015 | Kroneder ............ H01L 23/3675 361/715 |

FOREIGN PATENT DOCUMENTS

| | | |
|---|---|---|
| DE | 102012210158 A1 | 12/2013 |
| DE | 102014106570 A1 | 11/2015 |
| JP | H09148497 A | 6/1997 |
| JP | 2001015660 A | 1/2001 |
| JP | 2004253531 A | 9/2004 |
| JP | 2004288826 A | 10/2004 |
| JP | 2004356625 A | 12/2004 |
| WO | WO 03098686 A1 | 11/2003 |
| WO | WO 2011040313 A | 4/2011 |

* cited by examiner

SEMICONDUCTOR MODULE HAVING A BASE PLATE WITH A CONCAVE CURVATURE

CROSS-REFERENCES TO RELATED APPLICATIONS

This application is the U.S. National Stage of international Application No. PCT/EP2018/051258, filed Jan. 19, 2018, which designated the United States and has been published as International Publication No, WO 2018/134332 A1 and which claims the priority of European Patent Application, Serial No. 17152692.4, filed Jan. 23, 2017, pursuant to 35 U.S.C. 119(a)-(d).

BACKGROUND OF THE INVENTION

The present invention starts from a production method for a semiconductor module,
  wherein a structured metal layer is applied to an upper side of a substrate composed of an electrically insulating material, and at least one electronic component is contacted by the structured metal layer,
  wherein a metallic contact layer is applied to an underside of the substrate,
  wherein the underside of the substrate is designed as a planar surface in a state of the substrate which is free from mechanical stresses.

The present invention also starts from a semiconductor module,
  wherein the semiconductor module has a substrate composed of an electrically insulating material, to the upper side of which a structured metal layer is applied, which contacts at least one electronic component, and a metallic contact layer is applied to the underside of the component,
  wherein the underside of the substrate is designed as a planar surface in a state of the substrate which is free from mechanical stresses.

Production methods of this type and the semiconductor modules produced using such production methods are generally known. Reference can be made to DE 10 2008 036 112 A1 and corresponding US 2009/0 039 498 A1.

The semiconductor modules can be designed, both in the prior art as well as in the context of the present invention, in particular as power semiconductor modules, and as an electronic component can comprise a power semiconductor such as an IGBT or a similar component, for example a power MOSFET. Semiconductor modules of this kind can be used, for example, in electric cars for switching the power supply of traction motors. As an electronic component they can also have, for example, a power LED. The electronic components can have dimensions of 5 mm×5 mm and more. They can switch rated voltages of up to 2 kV in particular in the case of semiconductor switches. The switched rated currents can be in the two-digit or even three-digit ampere range.

In the case of semiconductor modules, the power loss from the semiconductor must be conducted into a heat sink. The layer structure used in this case is generally produced by soldering or sintering processes. If the heat sink were to be integrated directly here, the entire heat sink would have to be processed as well. In order to avoid this, as a rule, firstly only the semiconductor module without the heat sink is produced and the semiconductor module is then connected to the heat sink. The semiconductor module, which carries the power semiconductor, has on its side facing the heat sink either a contact layer with a thickness of several 100 μm or a base plate which is connected to the contact layer and has a thickness of several millimeters. In both cases, the transition to the heat sink is produced by a heat-conducting paste which serves to compensate for irregularities. The irregularities are therefore due to the fact that the insulating substrate cannot be pressed against the heat sink over its entire surface and/or that the plates can be distorted due to varying temperature expansions. Heat-conducting pastes of this kind have considerably poorer thermal conductivity than soldered or sintered connections. Furthermore, different aging effects occur.

If a base plate is used for what is referred to as heat spreading, the semiconductor module continues to contract on cooling due to the different coefficients of expansion of the substrate composed of an insulating material on the one hand and the metallic base plate on the other hand. As a result, the base plate has a concave curvature in its central region. In order to screw the base plate in the edge region, bending in the opposite direction is required, however. It is therefore known in the prior art to pre-bend the base plate to such an extent before it is connected to the contact layer that, after being connected to the contact layer, the base plate still rests in the center of the heat sink and the initially vertical edge is pressed onto the heat sink by corresponding connecting elements, as a rule by screw connections. To this end, on the one hand, the base plate must project far beyond the remaining structure of the semiconductor module. Furthermore, it is difficult to adjust the pre-bending correctly.

Furthermore, the resulting structure also has other disadvantages. Thus, for example, the planarity of the mounted base plate is usually rather poor. This is particularly true because the edge region is only pressed in the region of the connecting elements and relatively thick layers of the heat-conducting paste are still required. In addition, the problems remain with the aging effects of the heat-conducting paste. Furthermore, pre-bending of the base plate results in a relatively thick gap between the substrate and the base plate, which gap must be filled by a correspondingly thick solder layer. As a rule, the solder layer likewise has a significantly poorer coefficient of thermal conductivity than the contact layer and the base plate.

From DE 10 2008 036 112 A1 a semiconductor module is known which is composed of a multi-layer substrate having a plurality of metal layers and a plurality of ceramic layers. There is no base plate in this semiconductor module. The layers of the multi-layer substrate are pressed together during connecting of the layers by means of correspondingly curved clamping jaws. In one embodiment, the multilayer substrate has a concave curvature in a central region. The multilayer substrate is connected to the heat sink by a connecting element centrally penetrating the multilayer substrate. In this case, the concave curvature is eliminated, so the multilayer substrate rests flat on the heat sink.

The procedure described in DE 10 2008 036 112 A1 is not suitable for the production of a substrate with a base plate since excessive forces would be required in order to bend a base plate made of metal, which is several millimeters thick. Such forces would lead to destruction of the electrically active elements of the substrate, for example to detachment of the metal layer arranged on the upper side from the substrate and/or from the semiconductor module or detachment of the contact layer from the substrate. The procedure described in DE 10 2008 036 112 A1 is therefore practical only for semiconductor modules without a base plate.

The base plate brings about a considerable increase in the area over which the heat loss occurring in the electronic component can be dissipated. Without a base plate, only relatively weak electronic components can therefore be used or the electronic components cannot be operated over their full power range.

SUMMARY OF THE INVENTION

The method-related object of the present invention is to create a production method by means of which a flat connection to the heat sink can be effected in a simple manner in the case of a semiconductor module with a base plate.

According to one aspect of the invention, the object is achieved by a production method of the type mentioned in the introduction which is designed in such a way that the contact layer is connected to a metallic base plate by an intermediate layer, that the contact layer is connected to the metallic base plate at an elevated temperature and the semiconductor module is then cooled, that the side of the metallic base plate facing the substrate and the side of the metallic base plate facing away from the substrate are designed as planar surfaces in a state of the base plate, which is free from mechanical stresses, and that the base plate, on cooling of the semiconductor module, forms a concave curvature on its side facing away from the substrate, that the metallic base plate is connected to a heat sink by at least one connecting element arranged in a central region of the concave curvature and is pressed against the heat sink.

Advantageous embodiments of the production method are the subject matter of dependent claims.

According to the invention, the substrate and the base plate are produced as elements whose relevant surfaces—that is the sides of the substrate and base plate facing each other and the side of the base plate to be connected to the heat sink—are planar surfaces. The substrate and the base plate can therefore be produced in a simple manner. In this state, the substrate and the base plate are connected to one another. Due to the different coefficients of thermal expansion of the substrate and the base plate, mechanical stresses are, however, introduced into the substrate and the base plate on cooling after the substrate and the base plate are connected together. These mechanical stresses cause the semiconductor module to bend. In particular, they cause the base plate to have a concave curvature on its side facing away from the substrate after the semiconductor module has cooled.

During the subsequent completion of the semiconductor module, the metallic base plate is connected to a heat sink by at least one connecting element arranged in a central region of the concave curvature and is pressed against the heat sink. This type of connection makes it possible, in particular, to eliminate the concave curvature.

It is possible that the contact layer is connected to the metallic base plate and the electronic component makes contact with the structured metal layer at staggered intervals. Preferably, however, the contact layer is connected to the metallic base plate at the same time as the electronic component makes contact with the structured metal layer. This has advantages in terms of production engineering and, in addition, improves the reliability of the semiconductor module during later operation.

Due to the fact that the sides of the base plate and the substrate that face each other are completely planar at the instant of connecting, the thickness of the intermediate layer, as a rule a solder layer or a sintered layer, can be very small. Specifically, the intermediate layer can have a thickness of less than 100 µm, in particular a maximum thickness of 50 µm, for example a maximum of 20 µm.

It is possible to guide the connecting element "from above" through a recess in the semiconductor module and to fix it in the heat sink. Preferably, however, the connecting element is guided through a recess in the heat sink and fixed in the base plate.

In many cases, the base plate is composed of a relatively soft material, for example copper. For stability of the fastening, a holding element which interacts with the connecting element is therefore preferably embedded in the base plate and is composed of a harder material than the base plate. The harder material can be, for example, a steel or brass. The holding element can be, for example, a sleeve.

An indentation is preferably introduced in the base plate and/or the heat sink on their surfaces that face each other in the region of the connecting element. This makes it possible, in particular, for the region of the base plate and the heat sink, which is brought into contact directly with one another, to be maximized.

A distance between the base plate and the heat sink can be very small, often only a few micrometers. It is therefore not necessary in many cases to introduce a heat-conducting paste between the base plate and the heat sink. On the contrary, it is sufficient in many cases to introduce a solids-free oil or a gas between the base plate and the heat sink. These substances have, in particular, the advantage that they are not subject to ageing phenomena.

In order to optimize the concave curvature, the thickness of the base plate and the thickness of the substrate should be matched to one another. Specifically, the thickness of the base plate and the thickness of the substrate can be matched to one another in such a way that the thickness of the base plate is at least five times as large as the thickness of the substrate, in particular at least ten times as large.

According to another aspect of the invention, the object is achieved by a semiconductor module of the type mentioned in the introduction which is designed in such a way that the metallic contact layer is connected to a metallic base plate by an intermediate layer, that the side of the metallic base plate facing the substrate and the side of the metallic base plate facing away from the substrate are designed as planar surfaces in a state of the base plate, which is free from mechanical stresses, that the base plate, at room temperature of the semiconductor module, has a concave curvature on its side facing away from the substrate, that the metallic base plate is connected to a heat sink by at least one connecting element arranged in a central region of the concave curvature and is pressed against the heat sink.

Advantageous embodiments of the semiconductor module are the subject mailer of dependent claims.

The advantageous embodiments of the semiconductor module correspond essentially to the advantageous embodiments of the production method explained above.

BRIEF DESCRIPTION OF THE DRAWING

The above-described properties, features and advantages of this invention, as well as the manner in which they are achieved, will become dearer and more clearly understood in connection with the following description of the exemplary embodiments, which are explained in more detail in conjunction with the drawings. In the drawings, in a schematic representation.

DETAILED DESCRIPTION OF PREFERRED EMBODIMENTS

Figure 1:
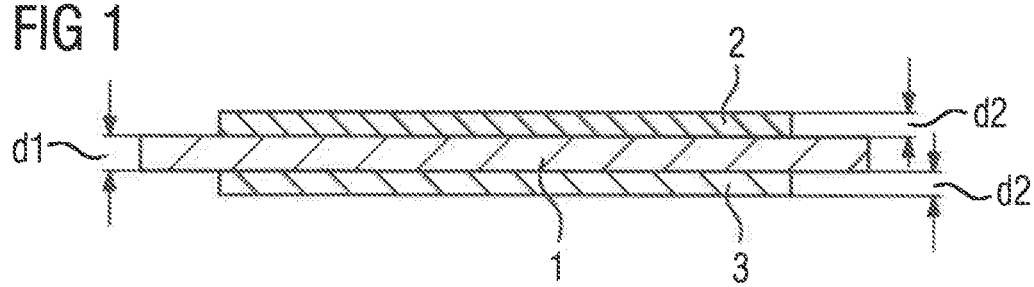
FIG. 1 shows a cross-section through a semiconductor module in an intermediate stage of production.

In order to produce a semiconductor module, according to FIG. 1 a structured metal layer 2 is first applied to an upper side of a substrate 1 composed of an electrically insulating material. The structured metal layer 2 is usually composed of copper. Alternatively, it can be composed of aluminum. Furthermore, a metallic contact layer 3 is applied to the underside of the substrate. The metallic contact layer 3 can also be composed of copper or aluminum. Usually it is composed of the same material as the structured metal layer. The metallic contact layer 3 can be applied simultaneously or at a staggered interval in order to apply the structured metal layer 2.

The substrate 1 can consist, for example, of Al2O3 (aluminum oxide), AlN (aluminum nitride) or Si3N4 (silicon nitride). The substrate 1, including the structured metal layer 2 and the contact layer 3, is preferably designed as what is known as a DBC substrate (Direct Bonded Copper), as a DAB substrate (Direct Aluminum Bonding) or as an AMB substrate (Active Metal Brazing). As a rule, the substrate 1 is in the form of a planar element. At least the underside of the substrate 1 is therefore a planar surface in a state of the substrate 1 which is free from mechanical stresses. The substrate 1 as such (in other words, without the layers 2, 3) has a thickness d1. The thickness d1 is generally between 0.38 mm and 1.00 mm. The layers 2, 3 usually have a thickness d2 which is in the range of approximately 0.3 mm.

Figure 2:
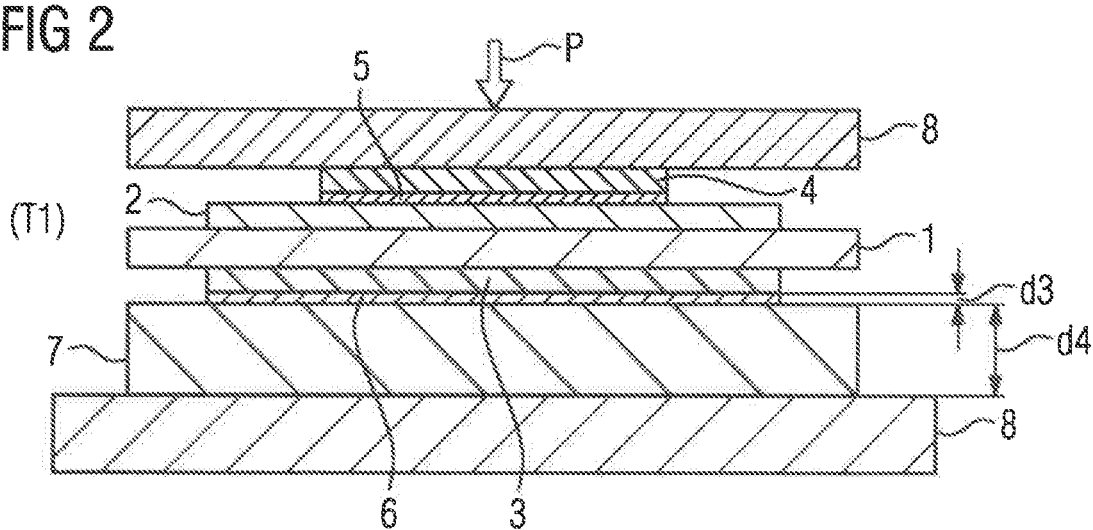
FIG. 2 shows a cross-section through the semiconductor module of FIG. 1 in a final stage of production.

In a later production step, according to FIG. 2 an electronic component 4 is applied to the structured metal layer 2 and is contacted by the structured metal layer 2. As a rule, contact is made by a thin intermediate layer 5, usually a solder or sintered layer. Furthermore, as is also shown in FIG. 2, the metallic contact layer 3 is connected by a further thin intermediate layer 6 to a metallic base plate 7. The further intermediate layer 6 is also a solder or sintered layer as a rule. The metallic base plate 7 is usually composed of the same material as the metallic contact layer 3. The metallic base plate 7 is also a planar element. In particular, the side of the metallic base plate 7 facing the substrate 1 and the side of the metallic base plate 7 facing away from the substrate 1 are designed as planar surfaces in a state of the base plate 7 which is free from mechanical stresses. According to the illustration in FIG. 2, the contact layer 3 is preferably connected to the metallic base plate 7 at the same time as the electronic component 4 makes contact with the structured metal layer 2.

Due to the inventive production process, in particular due to the fact that only planar surfaces have to be connected to one another by the intermediate layer 6, the intermediate layer 6 can be very thin. In particular, the intermediate layer 6 can have a thickness d3 below 100 μm. The thickness d3 can lie in particular in the range of a maximum of 50 μm, for example in the range of a maximum of 20 μm. In individual cases, the thickness d3 can even be lower, for example at about 10 μm. Connection by a thin intermediate layer 6 is advantageous in that, as a rule, the intermediate layer 6 has a considerably higher thermal resistance than the metallic contact layer 3 and the base plate 7.

The base plate 7 has a thickness d4. The thickness d4 is generally in the range of several millimeters, for example at 3 mm to 10 mm. It can be, for example, at least five times as large as the thickness d1 of the substrate 1, in particular at least ten times as large.

In order to connect the contact layer 3 to the metallic base plate 7 and to connect the electronic component 5 to the structured metal layer 2, a pressure p can be exerted on the substrate 1 (including the other elements 2 to 7) by press jaws 8. This is customary in particular in the case of a sintering process. In particular in the case of a soldering process, however, the exertion of the pressure p can be omitted. Furthermore, the substrate 1 (including the other elements) is brought to an elevated temperature T1, in particular a temperature above the later intended operating temperature of the substrate 1, usually above 100° C. In this state, the corresponding connections are produced. The intermediate layers 5, 6 formed in this case, in particular the intermediate layer 6, can nevertheless be very thin, because in this state the substrate 1 and the base plate 7 are planar. The semiconductor module is then cooled to a lower temperature T2, for example to room temperature, in other words, approximately 20° C.

Figure 3:
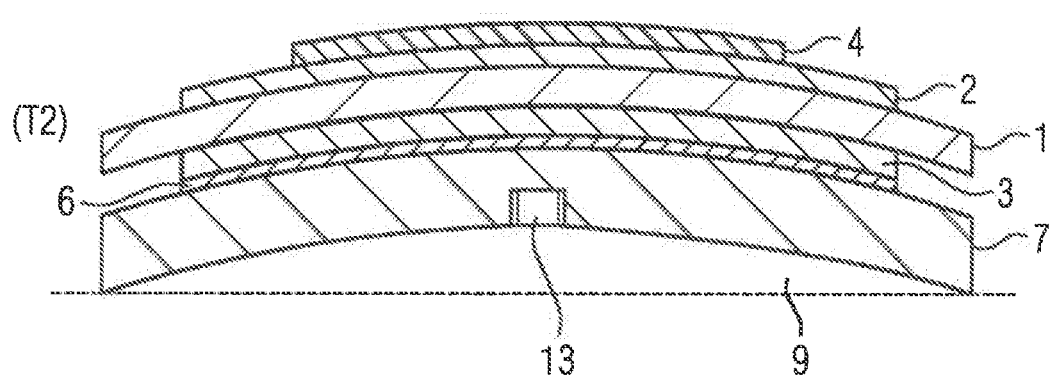
FIG. 3 shows a cross-section through the semiconductor module of FIG. 2 after complete production.

The substrate 1 and the base plate 7 have different coefficients of thermal expansion. In particular, the coefficient of thermal expansion of the substrate 1 is generally smaller than the coefficient of thermal expansion of the base plate 7. On cooling, the base plate 7 therefore shrinks to a greater extent than the substrate 1. As a result, mechanical stresses are formed in the semiconductor module comprising the substrate 1 and the base plate 7—in a manner similar to a bimetallic effect. These stresses lead to the base plate 7 forming a concave curvature 9 on cooling of the semiconductor module on its side facing away from the substrate 1 and having this concave curvature 9 in the cooled state. This state—albeit in exaggerated form—is shown in FIG. 3.

Figure 4:
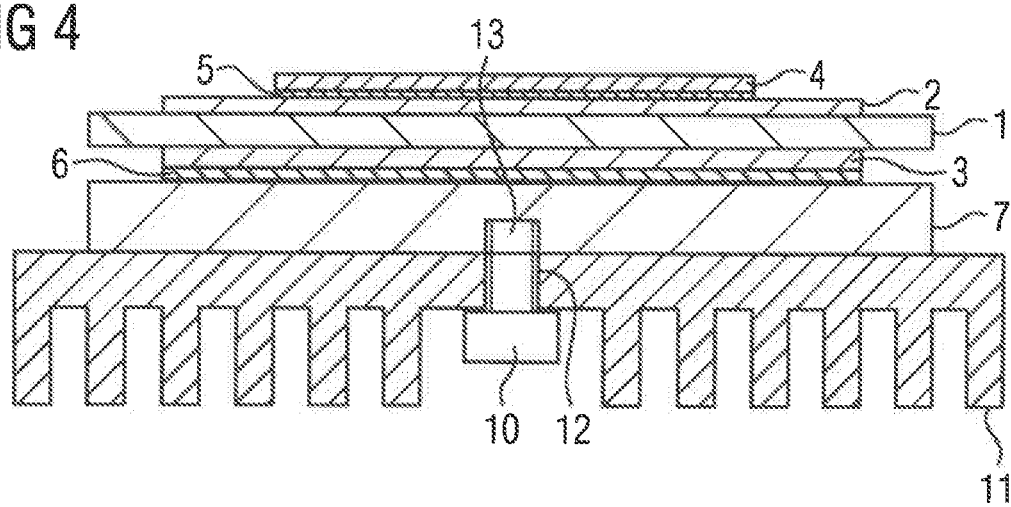
FIG. 4 shows a cross-section through the semiconductor module of FIG. 3 after mounting of a heat sink and FIG. 5 shows a possible modification of the semiconductor module of FIG. 4.

According to the representation in FIG. 4, the metallic base plate 7 is then connected to a heat sink 11 by at least one connecting element 10 and pressed against the heat sink 11. According to the representation in FIG. 4, the connecting element 10 is arranged in a central region of the concave curvature 9. Therefore, the connecting element 10 does not bend the outer regions of the base plate 7 downwards onto the heat sink 11, but rather the central region of the concave curvature 9. For this purpose, the connecting element 10 is preferably guided through a recess 12 in the heat sink 11 and fastened in the base plate 7.

The connecting element 10 can be designed, for example, as a screw which is screwed into a corresponding thread in the base plate 7. In particular if the base plate 7 is made of copper, the base plate 7 is quite soft, however. According to the representation in FIGS. 3 and 4, a holding element 13, which interacts with the connecting element 10, is therefore preferably embedded in the base plate 7. In this case, the holding element 13 is composed of a harder material than the base plate 7. For example, the holding element 13 can be composed of aluminum, brass or steel. The holding element 13 can be designed, in particular, as a sleeve which has an internal thread.

Figure 5:
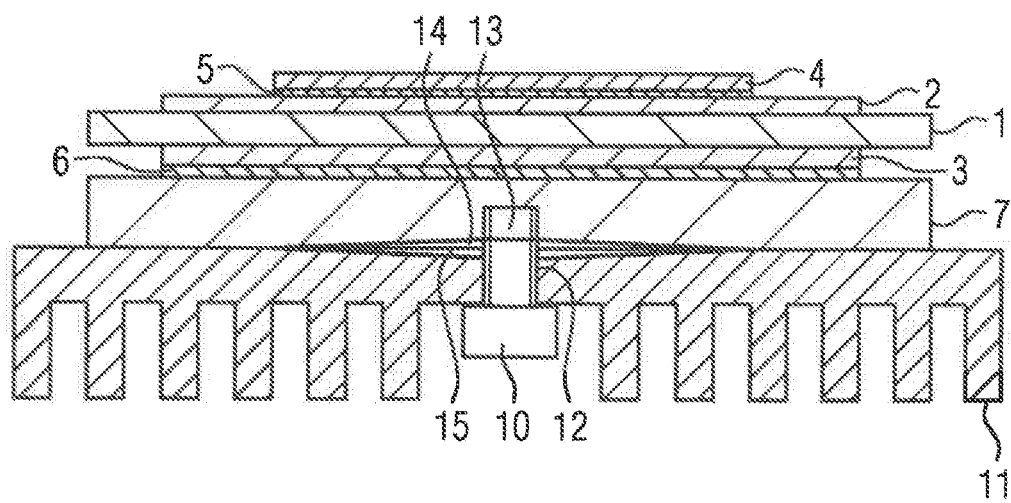

In a particularly preferred embodiment, according to the representation in FIG. 5, an indentation 14 is introduced into the base plate 7 on its surface facing the heat sink 11 in the region of the connecting element 10. Alternatively or in addition, an indentation 15 can be introduced into the heat sink 11 on its surface facing the base plate 7 in the region of the connecting element 10. This design makes it possible, in particular, for the connecting element 10 to bring a large part of the surfaces of the base plate 7 and the heat sink 11 that face each other into contact with one another.

A distance between the base plate 7 and the heat sink 11 can be very small. It can lie in the single-digit micrometer range. For this reason, it is not necessary to introduce a heat-conducting paste or the like between the base plate 7 and the heat sink 11. Instead, it is sufficient to introduce an solids-free oil between the base plate 7 and the heat sink 11, or to not introduce a separate medium between the base plate 7 and the heat sink 11, so only a few gas molecules are located there.

In summary, the present invention therefore relates to the following facts:

A structured metal layer 2 is applied to an upper side of a substrate 1 composed of an electrically insulating material, at least one electronic component 4 being contacted by said structured metal layer 2. A metallic contact layer 3 is applied to an underside of the substrate 1. The underside of the substrate 1 is in the form of a planar surface in a state of the substrate 1 which is free from mechanical stresses. The contact layer 3 is connected to a metallic base plate 7 by an intermediate layer 6. The contact layer 3 is connected to the metallic base plate 7 at an elevated temperature T1. The semiconductor module is then cooled. The side of the metal base plate 7 facing the substrate 1 and the side of the metallic base plate 7 facing away from the substrate 1 are designed as planar surfaces in a state of the base plate 7 which is free from mechanical stresses. On cooling of the semiconductor module, the base plate 7 forms a concave curvature 9 on its side facing away from the substrate 1.

The present invention has many advantages. Good heat dissipation from the electronic component 4 to the heat sink 11 results owing to the use of the base plate 7. Owing to the flatness of the surfaces of substrate 1 and base plate 7 to be connected together, a minimum thickness d3 of the intermediate layer 6 results during the production process of the semiconductor module. This is even true when the semiconductor module is produced without pressure. The gap between the base plate 7 and the heat sink 11 is also very small. Due to the fact that a plurality of electronic components 4 is usually arranged on the substrate 1, as a rule, the central region remains free of electronic components 4. The heat conduction in this region, which is slightly reduced by the connecting element 10 and possibly the holding element 13, can therefore be tolerated without difficulty. As a result of the fastening of the connecting element 10 in the base plate 7 (and not in the heat sink 11) a type of fastening is obtained in which the arrangement of the electronic components 4 must be taken into consideration only to a small extent. Due to the thermal expansion coefficients of the substrate 1 and the base plate 7, the concave curvature 9 decreases with increasing temperature, in other words during operation. The reduction of the concave curvature 9 improves and optimizes the dissipation of heat from the electronic components 4.

Although the invention has been illustrated and described in detail by the preferred exemplary embodiment, it is not limited by the disclosed examples and a person skilled in the art can derive other variations herefrom without departing from the scope of the invention.

The invention claimed is:

1. A method for the production of a semiconductor module, said method comprising:
    applying a structured metal layer of electrically insulating material to an upper side of a substrate such that an electronic component is contacted by the structured metal layer;
    applying a metallic contact layer to an underside of the substrate, with the underside configured as a planar surface when the substrate is in a state which is free from mechanical stress;
    connecting the contact layer to a metallic base plate via an intermediate layer at an elevated temperature to form a semiconductor module, wherein a side of the metal base plate facing the substrate and a side of the metallic base plate facing away from the substrate are configured as planar surfaces when the base plate is in a state which is free from mechanical stress;
    cooling the semiconductor module such that the base plate forms a concave curvature on the side facing away from the substrate;
    connecting the metallic base plate to a heat sink by a connecting element arranged in a central region of the concave curvature; and
    pressing the metallic base plate against the heat sink.

2. The method of claim 1, wherein the contact layer is connected to the metallic base plate at a same time as the electronic component contacts the structured metal layer.

3. The method of claim 1, wherein the intermediate layer is formed as a solder layer or as a sintered layer.

4. The method of claim 1, wherein the intermediate layer has a thickness below 100 μm.

5. The method of claim 1, further comprising:
    guiding the connecting element through a recess in the heat sink; and
    fastening the connecting element in the base plate.

6. The method of claim 1, further comprising embedding a holding element interacting with the connecting element in the base plate, wherein the holding element is made of a material which is harder than a material of the base plate.

7. The method of claim 1, further comprising introducing an indentation into the base plate and/or the heat sink on surfaces that face each other in a region of the connecting element.

8. The method of claim 1, further comprising introducing a solids-free oil or a gas between the base plate and the heat sink.

9. The method of claim 1, further comprising matching a thickness of the base plate and a thickness of the substrate to one another in such a way that the thickness of the base plate is at least five times as large as the thickness of the substrate.

10. The method of claim 1, wherein the intermediate layer has a maximum thickness of 50 μm.

11. The method of claim 1, wherein the intermediate layer has a maximum thickness of 20 μm.

12. The method of claim 1, further comprising matching a thickness of the base plate and a thickness of the substrate to one another in such a way that the thickness of the base plate is at least ten times as large as the thickness of the substrate.

13. A semiconductor module, comprising:
    a substrate made of electrically insulating material, said substrate having an upper side and an underside, said underside being configured as a planar surface when the substrate is in a state which is free from mechanical stress;

a structured metal layer applied to an upper side of the substrate for contacting an electronic component;

a metallic base plate having a first side facing the substrate and a second side facing away from the substrate, said first and second sides being configured as planar surfaces when the base plate is in a state which is free from mechanical stress, said base plate having a concave curvature on the second side, when the semiconductor module is at room temperature;

a metallic contact layer applied to an underside of the substrate and, connected to the metallic base plate via an intermediate layer;

a heat sink;

a connecting element for connecting the base plate to the heat sink in a central region of the concave curvature such that the base plate is pressed against the heat sink, and a holding element embedded in the base plate and interacting with the connecting element, said holding element being made of a material which is harder than a material of the base plate.

14. The semiconductor module of claim 13, wherein the intermediate layer is formed as a solder layer or as a sintered layer.

15. The semiconductor module of claim 13, wherein the intermediate layer has a thickness below 100 μm.

16. The semiconductor module of claim 13, wherein the connecting element is guided through a recess in the heat sink and is fastened in the base plate.

17. The semiconductor module of claim 13, wherein at least one of the base plate and the heat sink has an indentation on their surfaces that face each other in a region of the connecting element.

18. The semiconductor module of claim 13, further comprising a solids-free oil or a gas located between the base plate and the heat sink.

19. The semiconductor module of claim 13, wherein the base plate has a thickness which is at least five times as large as a thickness of the substrate.

20. The semiconductor module of claim 13, wherein the intermediate layer has a maximum thickness of 50 μm.

21. The semiconductor module of claim 13, wherein the intermediate layer has a maximum thickness of 20 μm.

22. The semiconductor module of claim 13, wherein the base plate has a thickness which is at least ten times as large as a thickness of the substrate.

* * * * *

UNITED STATES PATENT AND TRADEMARK OFFICE
CERTIFICATE OF CORRECTION

PATENT NO. : 11,201,098 B2
APPLICATION NO. : 16/479842
DATED : December 14, 2021
INVENTOR(S) : Bernd Kürten It is certified that error appears in the above-identified patent and that said Letters Patent is hereby corrected as shown below:

On the Title Page

Under (30) Foreign Application Priority Data:
Replace "EP 17152692" with the correct -- EP 17152692.4 --.

On page 2, under (56) FOREIGN PATENT DOCUMENTS:
Replace "JP 2004288826 A" with the correct -- JP 2004288828 A --.

Signed and Sealed this
Fifteenth Day of February, 2022

Drew Hirshfeld
*Performing the Functions and Duties of the*
*Under Secretary of Commerce for Intellectual Property and*
*Director of the United States Patent and Trademark Office*